United States Patent
Kumagai

(10) Patent No.: US 9,595,608 B2
(45) Date of Patent: Mar. 14, 2017

(54) SEMICONDUCTOR DEVICE

(71) Applicant: FUJI ELECTRIC CO., LTD., Kawasaki-shi (JP)

(72) Inventor: Naoki Kumagai, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/621,369

(22) Filed: Feb. 12, 2015

(65) Prior Publication Data
US 2015/0162432 A1 Jun. 11, 2015

Related U.S. Application Data

(63) Continuation of application No. PCT/JP2013/053439, filed on Feb. 13, 2013.

(51) Int. Cl.
*H01L 29/78* (2006.01)
*H01L 29/06* (2006.01)
(Continued)

(52) U.S. Cl.
CPC ........ *H01L 29/7802* (2013.01); *H01L 21/046* (2013.01); *H01L 29/0634* (2013.01);
(Continued)

(58) Field of Classification Search
CPC ............. H01L 29/1608; H01L 29/7802; H01L 29/1602; H01L 29/1095; H01L 29/2003; H01L 29/0684; H01L 29/7806
(Continued)

(56) References Cited

U.S. PATENT DOCUMENTS 7,221,010 B2 5/2007 Ryu
2006/0057796 A1* 3/2006 Harada ............... H01L 21/0465
438/199
(Continued)

FOREIGN PATENT DOCUMENTS

CN 1729577 A 2/2006
CN 101065847 A 10/2007
(Continued)

Primary Examiner — Christine Enad
(74) Attorney, Agent, or Firm — Rabin & Berdo, P.C.

(57) ABSTRACT

An $n^-$ drift region is disposed on the front surface of an $n^+$ semiconductor substrate composed of a wide band gap semiconductor. A p-channel region is selectively disposed on the surface layer of the $n^-$ drift region. A high-concentration $p^+$ base region is disposed so as to adjoin the lower portion of the p-channel region inside the $n^-$ drift region. Inside the high-concentration $p^+$ base region, an $n^+$ high-concentration region is selectively disposed at the $n^+$ semiconductor substrate side. The $n^+$ high-concentration region has a stripe-shaped planar layout extending to the direction that the high-concentration $p^+$ base regions line up. The $n^+$ high-concentration region adjoins a JFET region at one end portion in longitudinal direction of the stripe. Further, the $n^+$ semiconductor substrate side of the $n^+$ high-concentration region adjoins the part sandwiched between the high-concentration $p^+$ base region and the $n^+$ semiconductor substrate in the $n^-$ drift region.

20 Claims, 14 Drawing Sheets

(51) Int. Cl.
  *H01L 21/04* (2006.01)
  *H01L 29/66* (2006.01)
  *H01L 29/10* (2006.01)
  *H01L 29/08* (2006.01)
  *H01L 29/739* (2006.01)
  *H01L 29/16* (2006.01)
  *H01L 29/20* (2006.01)

(52) U.S. Cl.
  CPC ...... *H01L 29/0684* (2013.01); *H01L 29/0878* (2013.01); *H01L 29/0886* (2013.01); *H01L 29/1095* (2013.01); *H01L 29/66068* (2013.01); *H01L 29/7395* (2013.01); *H01L 29/1602* (2013.01); *H01L 29/1608* (2013.01); *H01L 29/2003* (2013.01)

(58) Field of Classification Search
  USPC .............................................. 257/76–77, 329
  See application file for complete search history.

(56) References Cited

U.S. PATENT DOCUMENTS

| 2006/0102908 A1 | 5/2006 | Imai et al. |
| 2009/0134402 A1 | 5/2009 | Yatsuo et al. |
| 2009/0134434 A1 | 5/2009 | Werner |
| 2009/0189228 A1* | 7/2009 | Zhang ................ H01L 29/1095 257/402 |
| 2010/0012951 A1 | 1/2010 | Yatsuo et al. |
| 2010/0295060 A1* | 11/2010 | Kudou ................ H01L 29/7828 257/77 |
| 2011/0227154 A1 | 9/2011 | Ono et al. |
| 2012/0223339 A1* | 9/2012 | Mizukami ........... H01L 27/0727 257/77 |
| 2013/0240904 A1* | 9/2013 | Kono .................. H01L 29/1608 257/77 |
| 2014/0055901 A1* | 2/2014 | Sung .................... H01L 29/808 361/93.9 |
| 2014/0183553 A1* | 7/2014 | Zhang ............... H01L 29/66068 257/77 |

FOREIGN PATENT DOCUMENTS

| JP | 557-153469 A | 9/1982 |
| JP | 2005-175174 A | 6/2005 |
| JP | 2009-054765 A | 3/2009 |
| JP | 2009-158788 A | 7/2009 |
| JP | 2011-023757 A | 2/2011 |
| JP | 2012-064741 A | 3/2012 |
| JP | 5071763 B2 | 11/2012 |

* cited by examiner

SEMICONDUCTOR DEVICE

This application is a continuation under 35 U.S.C. 120 of International Application PCT/JP2013/053439 having the International Filing Date of Feb. 13, 2013. The identified application is fully incorporated herein by reference.

BACKGROUND

Technical Field

This invention relates to a semiconductor device.

Background Art

It is expected that semiconductor materials such as silicon carbide (SiC), gallium nitride (GaN), and diamond, which have band gaps wider than silicon (hereinafter, described as wide band gap semiconductors), are applied to power devices especially because of excellent characteristics such as a high dielectric breakdown field and high thermal conductivity. For conventional power devices, for example, a vertical MOSFET (metal oxide field effect transistor) fabricated by using SiC (hereinafter, SiC vertical MOSFET), will be described. FIG. 14 is a sectional view illustrating a structure of the conventional SiC vertical MOSFET.

As shown in FIG. 14, in the conventional SiC vertical MOSFET, an $n^-$ drift region 102, which is formed by epitaxial growth, is disposed on the front surface of an $n^+$ semiconductor substrate 101 to be an $n^+$ drain region. A p-channel region 103 is selectively disposed on a surface layer of the $n^-$ drift region 102 in which the surface layer is located at the side opposite to the $n^+$ semiconductor substrate 101. Inside the $n^-$ drift region 102, a high-concentration $p^+$ base region 104 is disposed so as to adjoin the p-channel region 103 at the lower part of the p-channel region 103 (the $n^+$ semiconductor substrate 101 side).

The high-concentration $p^+$ base region 104 has a function to prevent the p-channel region 103 from punch-through if a reverse bias is highly applied on the pn junction between the p-channel region 103 and the $n^-$ drift region 102. An $n^+$ source region 105 and a $p^+$ contact region 106 are selectively disposed inside the p-channel region 103. A gate electrode 108 is disposed through a gate dielectric film 107 on the surface stretching from one to the other of the parts sandwiched between the $n^+$ source region 105 and the $n^-$ drift region 102 in each of the p-channel regions 103 via the surface of the $n^-$ drift region 102 next to the both parts.

It is known that inside the $n^-$ drift region 102, a junction field effect transistor (JFET) region 102a sandwiched by high-concentration $p^+$ base regions 104 next to each other has an impurity concentration higher than the other part of the $n^-$ drift region 102 in order to reduce the JFET resistance. A source electrode 109 contacts with the $n^+$ source region 105 and the $p^+$ contact region 106. A drain electrode 110 is disposed on the back surface of the $n^+$ semiconductor substrate 101.

Next, basic operation of the SiC vertical MOSFET will be described. In the off-state, if a high voltage, which is higher than an electric potential of the source electrode 109, is applied on a drain electrode 110, the junction formed between the $n^-$ drift region 102 and the p-channel region 103 is reverse-biased to form a blocking state. In the state, if a voltage that is equal to or higher than the threshold is applied on the gate electrode 108, charges begin to be accumulated in the gate electrode 108. Simultaneously, an area adjoining the gate dielectric film 107 in the p-channel region 103 is inverted to form an n-channel region (not shown).

Forming the n-channel region at the place between the $n^+$ source region 105 and the $n^-$ drift region 102 causes the reverse biased junction to disappear on the passage that passes the n-channel region. Then this forms an electron pathway that passes the source electrode 109, the $n^+$ source region 105, the n-channel region, the $n^-$ drift region 102, the $n^+$ semiconductor substrate 101, and the drain electrode 110. Thus this allows a current to flow from the drain electrode 110 to the source electrode 109. That is, the SiC vertical MOSFET is turned into the on-state.

On the other hand, if a voltage applied between the source electrode 109 and gate electrode 108 becomes smaller than the threshold, charges accumulated in the gate electrode 108 are discharged. Then this permits the n-channel region inverted to n-type in the p-channel region 103 to return to p-type and then to disappear. Therefore, the electron pathway connected from the drain electrode 110 to the source electrode 109 vanishes away, and no current flows. Thus the SiC vertical MOSFET is turned into the off-state.

As described above, the basic operation of the SiC vertical MOSFET is not different from that of a Si MOSFET manufactured using Si. But, as described earlier, the wide band gap semiconductor has higher dielectric breakdown field intensity in comparison with Si (approximately 10 times higher for 4H—SiC, 11 times for GaN, and 19 times for diamond). Then this allows the impurity concentration to increase in the $n^-$ drift region 102, and permits the thickness to decrease in the $n^-$ drift region 102 for the SiC vertical MOSFET. Thus it is possible to realize both high breakdown voltage and low on-state resistance.

As described above, a MOSFET fabricated using the wide band gap semiconductor has a high dielectric breakdown field intensity. Then this allows the impurity concentration to increase (allows the resistance to decrease) in the $n^-$ drift region 102. And then, increasing the impurity concentration of the $n^-$ drift region 102 allows the extension of the depletion layer to decrease from the pn junction formed between the p-channel region 103 and the $n^-$ drift region 102 to the $n^-$ drift region 102 side. Then this allows a minimum required thickness of the $n^-$ drift region 102 to decrease in order to realize a predetermined breakdown voltage. Thus it is possible to reduce the on-state resistance further.

As such a semiconductor device fabricated using the wide band gap semiconductor, in the SiC vertical MOSFET fabricated by a method that a channel region is formed using a low concentration p-type epitaxial layer whose conductivity type is inverted from p-type to n-type by performing ion implantation to form an electron guide path (an inverted layer), there is provided a device that a second inverted layer is disposed at the position approximately equivalent distance on right and left sides from the inverted layer, and the source layers on right and left sides are formed so that each of the inside edges thereof is positioned inside the second inverted layer (for example, see the following Patent literature 1).

Patent literature 1: Japanese Patent No. 5071763

However, if a voltage that is equal to or higher than the threshold is applied on the gate electrode 108, a current that flows through an inversion layer (an n-channel region) formed at the surface of the p-channel region 103 flows from the drain electrode 110 to the JFET region 102a via the $n^+$ semiconductor substrate 101 and the $n^-$ drift region 102. At the time, most of the current flows to a high current density part 102b, which is sandwiched between the JFET region 102a and the $n^+$ semiconductor substrate 101, in the $n^-$ drift region 102.

On the other hand, a low current density part 102c, which is sandwiched between the high-concentration $p^+$ base region 104 and the $n^+$ semiconductor substrate 101, in the $n^-$ drift region 102 results in an ineffective region where any current hardly flows. FIG. 14 shows approximately the high current density part 102b and the low current density part 102c in the n⁻ drift region 102. If the ineffective region is formed in the n⁻ drift region 102 as described above, resistance of the n⁻ drift region 102 increases unexpectedly owing to so-called spreading resistance.

The thinner the thickness of the n⁻ drift region 102 becomes, the more remarkably the problem that the resistance of the n⁻ drift region 102 increases owing to the ineffective region formed in the n⁻ drift region 102 appears. Then this causes features obtained by employing the wide band gap semiconductor to be lost. The problem may be resolved so that when using micro-fabrication technology, the widths of the high-concentration p⁺ base regions 104 are narrowed, and also the spaces are narrowed among a plurality of the JFET regions 102a.

However, there is a limit for reducing the size of the high-concentration p⁺ base region 104. Further, if a width of the JFET region 102a should widen, an effect that relaxes an electric field applied on the gate dielectric film 107 will decline, wherein the effect is obtained because the JFET region 102a is pinched-off by the depletion layer extending from the pn junction between the high-concentration p⁺ base region 104 and the n⁻ drift region 102 to the n⁻ drift region 102 side. And then this causes adverse effects such as oxide film breakage and the breakdown voltage lowering. Along with this, there is a new problem that the on-state voltage increases owing to cell density decline.

In order to solve the problems in the conventional art described above, it is an object of the invention to provide a semiconductor device having high breakdown voltage. Further, in order to solve the problems in the conventional art described above, it is another object of the invention to provide a semiconductor device having low on-state resistance.

SUMMARY

In order to solve the problems described above, and to achieve the object of the present invention, the semiconductor device according to the invention comprises the following. A first-conductive first semiconductor region composed of the semiconductor material having an impurity concentration lower than the semiconductor substrate is disposed on the front surface of a first-conductive or second-conductive semiconductor substrate composed of a semiconductor material with a band gap wider than silicon. A second-conductive second semiconductor region is selectively disposed on a surface layer of the first semiconductor region in which the surface layer is located at the side opposite to the semiconductor substrate. A first-conductive third semiconductor region is selectively disposed inside the second semiconductor region. A first-conductive fourth semiconductor region, which is separated from the third semiconductor region, having an impurity concentration higher than the first semiconductor region is selectively disposed inside the second semiconductor region. The fourth semiconductor region adjoins the first semiconductor region at least at a part thereof. A gate electrode is disposed through a gate dielectric film on the surface stretching from one to the other of the parts sandwiched between the third semiconductor region and the first semiconductor region in each of the second semiconductor regions via the surface of the first semiconductor region next to the both parts. A first electrode is disposed so as to contact with the second semiconductor region and the third semiconductor region. A second electrode is disposed so as to contact with the back surface of the semiconductor substrate.

Further, in the semiconductor device according to the above aspect of the invention, the second semiconductor region comprises a first region adjoining the gate dielectric film and a second region that has an impurity concentration higher than the first region and adjoins the first region at the semiconductor substrate side thereof. And the fourth semiconductor region is selectively disposed inside the second region.

Furthermore, in the semiconductor device according to the above aspect of the invention, the second region is divided into a third region disposed at the first region side thereof and a fourth region disposed at the semiconductor substrate side thereof by the fourth semiconductor region. And a part of the fourth semiconductor region of which the part is disposed at the fourth region side is selectively disposed inside the fourth region so as to adjoin the first semiconductor region.

Also, in the semiconductor device according to the above aspect of the invention, the second region is divided into the third region disposed at the first region side thereof and the fourth region disposed at the semiconductor substrate side thereof by the fourth semiconductor region. And apart of the first semiconductor region of which the part is disposed at the fourth region side is selectively disposed inside the fourth region so as to adjoin the fourth semiconductor region.

Moreover, in the semiconductor device according to the above aspect of the invention, the fourth semiconductor region and the fourth region are further disposed between one part of the first semiconductor region in which the one part adjoins the gate dielectric film and the other part of the first semiconductor region.

Further, in the semiconductor device according to the above aspect of the invention, an impurity concentration of the one part adjoining the gate dielectric film in the first semiconductor region is higher than that of an impurity concentration of the other part in the first semiconductor region.

Furthermore, in the semiconductor device according to the above aspect of the invention, the semiconductor substrate is second conductivity type, and the semiconductor device has a first-conductive region having an impurity concentration higher than the first semiconductor region, wherein the first-conductive region is disposed between the first-conductive first semiconductor region and the second-conductive semiconductor substrate.

Also, in the semiconductor device according to the above aspect of the invention, the semiconductor material is silicon carbide, gallium nitride, or diamond.

According to the above aspect of the invention, the fourth semiconductor region is disposed at the semiconductor substrate side of the inner part of the second semiconductor region so as to adjoin the first semiconductor region. And then in the off-state, the spread depletion layer from the pn junction between the second semiconductor region and the fourth semiconductor region to the first semiconductor region side allows the fourth semiconductor region to be pinched off. Then this can prevent the breakdown voltage from lowering. Further, according to the invention described above, the fourth semiconductor region is disposed at the semiconductor substrate side of the inner part of the second semiconductor region so as to adjoin the first semiconductor region. And then a current that flows from the second electrode to the first electrode flows from the whole of the first semiconductor region to the fourth semiconductor region, passing through the fourth semiconductor region to flow into a JFET region (a part adjoining the gate dielectric film in the first semiconductor region). Thus the ineffective region that almost no current flows will not be formed. Therefore, it is possible to reduce effective resistance of the first semiconductor region.

According to the semiconductor device of the present invention, there is provided a beneficial effect that on-state resistance thereof can be reduced without the degradation of breakdown voltage.

DETAILED DESCRIPTION

Figure 1:
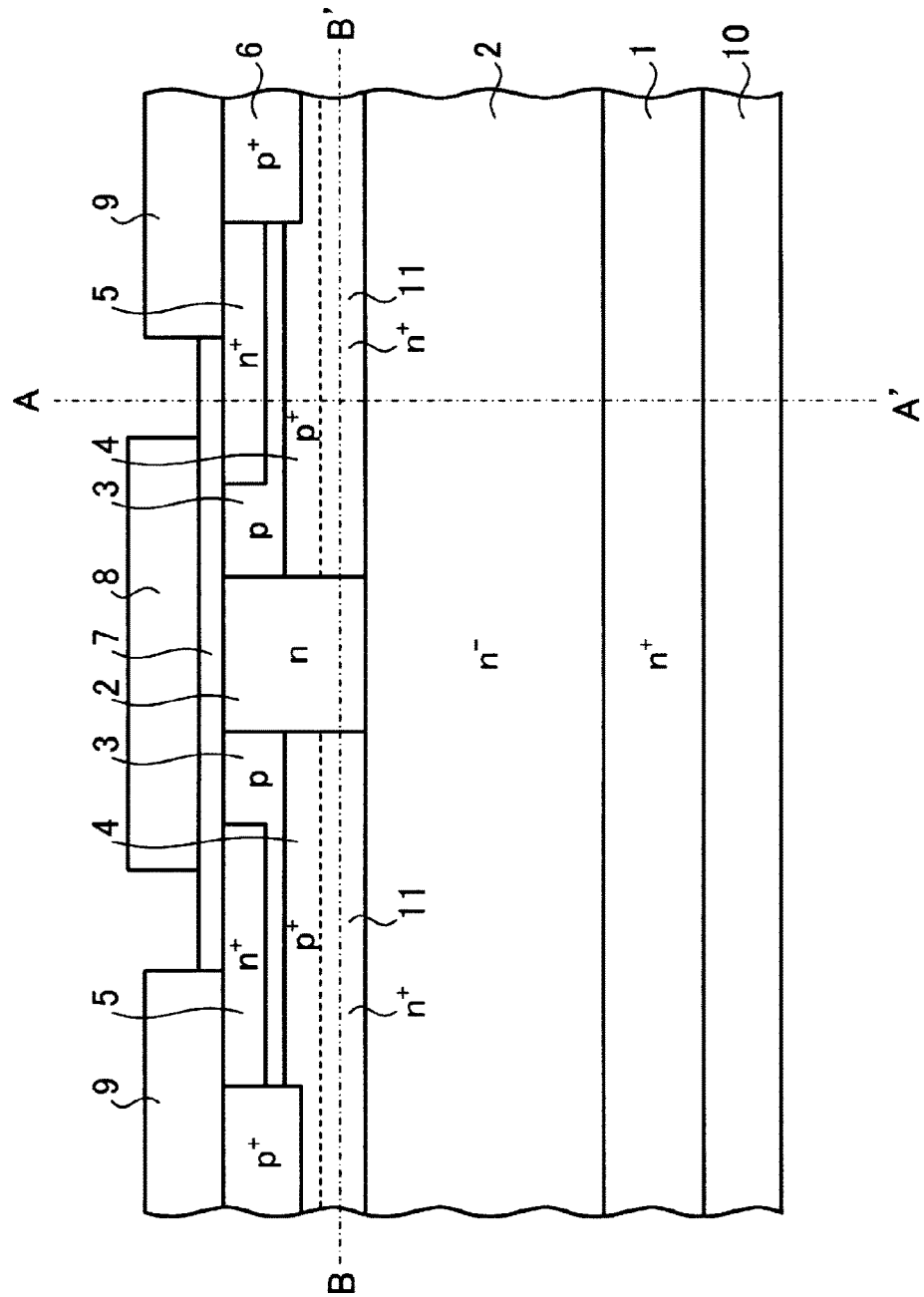
FIG. 1 is a sectional view illustrating a structure of a semiconductor device according to a first embodiment.

Referring to attached figures in the following, preferred embodiments of the semiconductor device according to the invention will be described in detail. In the present description and the attached figures, "n" and "p" prefixed to layers and regions indicate that the majority carriers are an electron and a hole, respectively. "+" and "−" appended to an "n" or a "p" indicate that the impurity concentrations are higher and lower, respectively, than layers and regions without "+" and "−". In addition, according to the description of the embodiment and the attached figures, the same reference numerals are given to identical configurations and redundant descriptions thereof will not be provided.

First Embodiment

Figure 2:
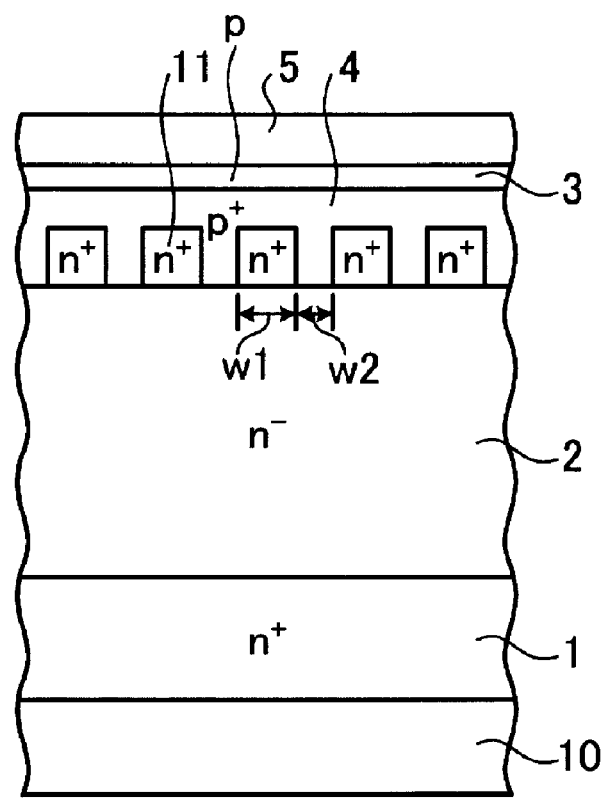
FIG. 2 is a sectional view cut along the line A-A' shown in FIG. 1.
Figure 3:
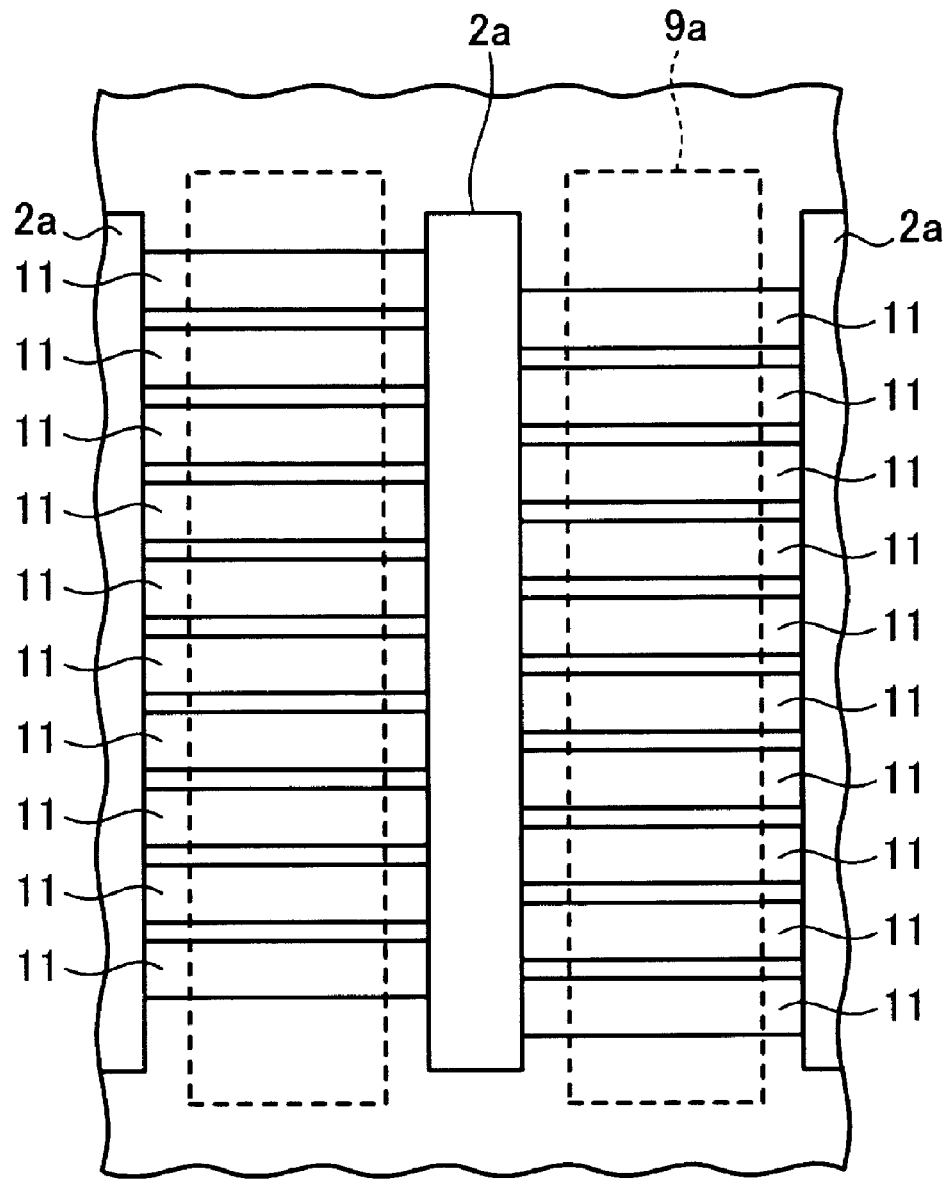
FIG. 3 is a plan view cut along the line B-B' shown in FIG. 1.

A structure of a semiconductor device according to the first embodiment will be described. FIG. 1 is a sectional view illustrating a structure of a semiconductor device according to the first embodiment. FIG. 2 is a sectional view cut along the line A-A' shown in FIG. 1. FIG. 3 is a plan view cut along the line B-B' shown in FIG. 1. The semiconductor device according to the first embodiment shown in FIG. 1 is a wide band gap semiconductor device fabricated using a semiconductor material having a band gap wider than silicon (Si) such as silicon carbide (SiC), gallium nitride (GaN), or diamond (wide band gap semiconductor). FIG. 1 shows a cell structure of the wide band gap semiconductor device. FIG. 3 shows a situation that the cell structure shown in FIG. 1 is arranged in parallel.

In the wide band gap semiconductor device shown in FIGS. 1 to 3, an $n^-$ drift region (a first semiconductor region) 2 is disposed by epitaxial growth on the front surface of an $n^+$ semiconductor substrate 1 composed of the wide band gap semiconductor. A p-channel region (a first region) 3 is selectively disposed on a surface layer of the $n^-$ drift region 2 in which the surface layer is located at the side opposite to the $n^+$ semiconductor substrate 1. Inside the $n^-$ drift region 2, a high-concentration $p^+$ base region (a second region) 4 is disposed at the bottom part of the p-channel region 3 ($n^+$ semiconductor substrate 1 side) so as to adjoin the p-channel region 3. A p-type base region (a second semiconductor region) is comprised of the p-channel region 3 and the high-concentration $p^+$ base region 4.

The high-concentration $p^+$ base region 4 has a function to prevent the p-channel region 3 from punch-through if a reverse bias is highly applied on the pn junction between the p-channel region 3 and the $n^-$ drift region 2. In the $n^-$ drift region 2, the impurity concentration of the JFET region 2a sandwiched between the high-concentration $p^+$ base regions 4 next to each other is higher than that of the other part of the $n^-$ drift region 2 in order to reduce the JFET resistance. Inside the high-concentration $p^+$ base region 4, an $n^+$ high-concentration region (a fourth semiconductor region) 11 is selectively disposed at the $n^+$ semiconductor substrate 1 side thereof.

The $n^+$ high-concentration region 11 adjoins the $n^-$ drift region 2 at least at a part thereof. Concretely, the $n^+$ high-concentration region 11 has, for example, a stripe-shaped planar layout extending to the direction that the high-concentration $p^+$ base regions 4 line up. The $n^+$ high-concentration region 11 adjoins the JFET region 2a at one end portion of the stripe in longitudinal direction. Further, the $n^+$ semiconductor substrate 1 side of the $n^+$ high-concentration region 11 adjoins a part of the $n^-$ drift region 2 in which the part is sandwiched between the high-concentration $p^+$ base region 4 and the $n^+$ semiconductor substrate 1.

The $n^+$ high-concentration region 11 may be arranged by shifting a trench-pitch so that the end portions of the stripes, which sandwich the JFET region 2a, do not confront each other in longitudinal direction of the $n^+$ high-concentration region 11 (so that the $n^+$ high-concentration region 11 confronts the high-concentration $p^+$ base region 4 that corresponds to the part sandwiched between the $n^+$ high-concentration regions 11). The reason is that in a part of the JFET region 2a in which the part is sandwiched by the $n^+$ high-concentration regions 11, a depletion layer hardly extends from the pn junction between the high-concentration $p^+$ base region 4 and the $n^-$ drift region 2 to the $n^-$ drift region 2 side. And then the JFET region 2a is hardly pinched off when reverse-biased. A $p^+$ contact region 6, which is described later, will be omitted to illustrate in FIG. 3. A reference numeral 9a shows a source contact disposed in an inter-layer dielectric film (not shown) in order to get in contact with a source electrode 9.

An n+ source region (a third semiconductor region) 5 and the p+ contact region 6 are selectively disposed inside the p-channel region 3. The p+ contact region 6 penetrates through the p-channel region 3 in the depth direction and reaches the high-concentration p+ base region 4. A gate electrode 8 is disposed through a gate dielectric film 7 on the surface stretching from one to the other of the parts sandwiched between the n+ source region 5 and the n− drift region 2 in each of the p-channel regions 3 via the surface of the n− drift region 2 next to the both parts. That is, the gate electrode 8 is disposed on the surface of the p-channel regions 3 and the n− drift region 2, which are disposed between the n+ source regions 5 next to each other. The source electrode (the first electrode) 9, which contacts with the n+ source region 5 and the p+ contact region 6, is electrically insulated from the gate electrode 8 by the inter-layer dielectric film. The n+ semiconductor substrate 1 constitutes an n+ drain region. A drain electrode (a second electrode) 10 is disposed at the backside of the n+ semiconductor substrate 1.

Figure 4:
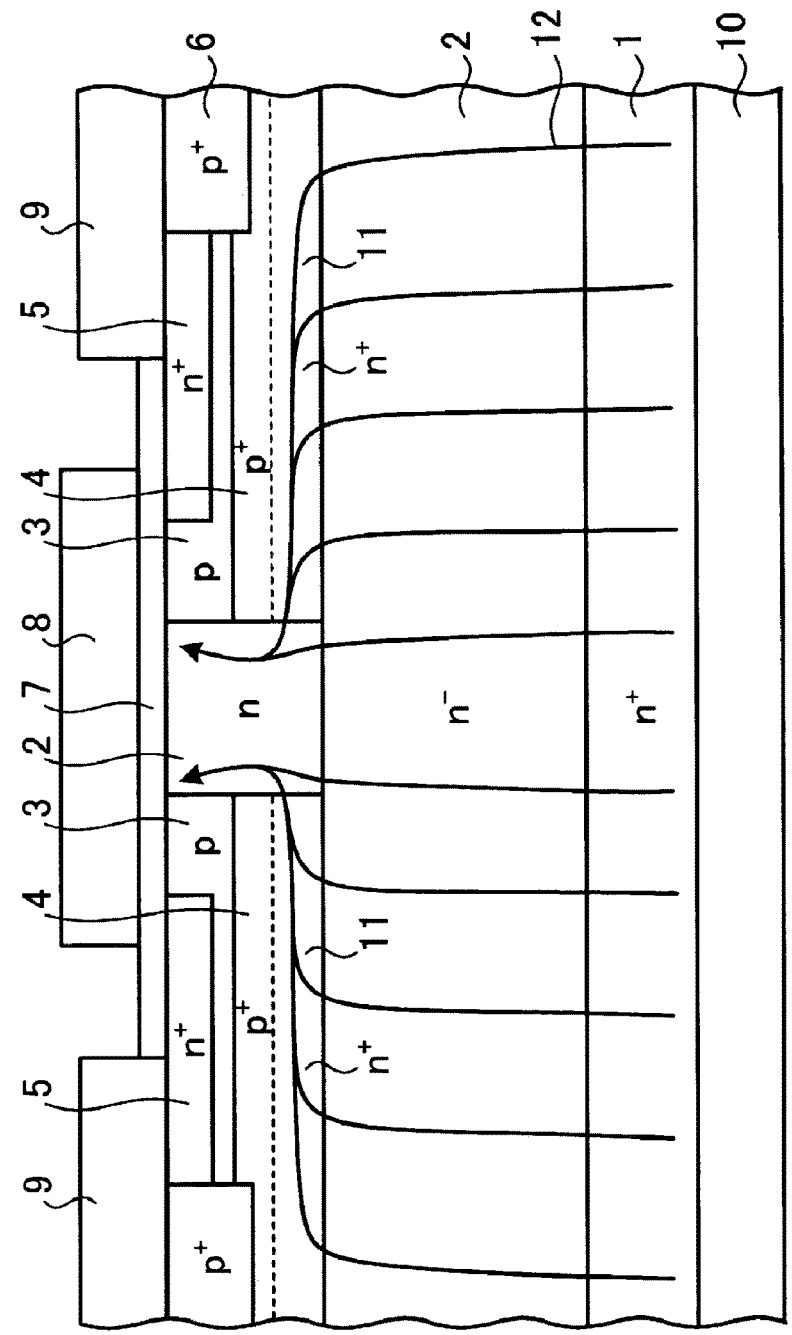
FIG. 4 is a sectional view illustrating a current pathway of the semiconductor device according to the first embodiment shown in FIG. 1.

Next, a current pathway of the wide band gap semiconductor device according to the first embodiment will be described. FIG. 4 is a sectional view illustrating the current pathway of the semiconductor device according to the first embodiment. As shown in FIG. 4, in the off-state, if a voltage higher than electric potential of the source electrode 9 is applied to the drain electrode 10, the junction between the n− drift region 2 and the p-channel region 3 is reverse-biased to form a blocking state. In the state, if a voltage that is equal to or higher than the threshold is applied to the gate electrode 8, an area of the p-channel region 3 in which the area adjoins the gate dielectric film 7 is inverted to form an n-channel region (not shown).

Forming the n-channel region at the place between the n+ source region 5 and the n− drift region 2 causes the reverse biased junction to disappear at the passage that passes the n-channel region. Then a current 12 flows from the drain electrode 10 to the source electrode 9. At the time, the current 12 flowing from the drain electrode 10 to the source electrode 9 flows from a part of the n− drift region 2 in which the part is sandwiched between the n+ semiconductor substrate 1 and both of the high-concentration p+ base region 4 and the n+ high-concentration region 11 to the n+ high-concentration region 11, along with flowing from a part of the n− drift region 2 in which the part is sandwiched between the n+ semiconductor substrate 1 and the JFET region 2a to the JFET region 2a.

As described above, the current 12 flows from the whole of the n− drift region 2 into the n+ high-concentration region 11, flowing into the source electrode 9 through the n+ high-concentration region 11 and the JFET region 2a. Then an invalid region, in which the current 12 hardly flows, is not formed inside the n− drift region 2. Therefore, this can prevent resistance increase caused by spreading resistance in the n− drift region 2. That is, this allows effective resistance to reduce in the n− drift region 2. The higher the impurity concentration of the n+ high-concentration region 11 is, the more remarkably such an effect appears.

If the n+ high-concentration region 11 is set to be a high impurity concentration, the breakdown voltage might decrease. Then, in order to perform the pinch-off of the n+ high-concentration region 11 easily by the depletion layer extending from the pn junction between the high-concentration p+ base region 4 and both of the n+ high-concentration region 11 and the n− drift region 2 to the n− drift region 2 side, it is preferable that the higher the impurity concentration of the n+ high-concentration region 11 is set, the narrower the width w1 of the n+ high-concentration region 11 in short direction of the stripe (stripe width of the n+ high-concentration region 11). On the other hand, it is possible that the higher the impurity concentration of the high-concentration p+ base region 4 is set, the narrower the width w2 of the high-concentration p+ base region 4 in short direction of the stripe. Then, it is effective that the impurity concentration of the high-concentration p+ base region 4 is set to be higher, and the width w2 of the high-concentration p+ base region 4 to be narrower.

As described above, according to the first embodiment, the n+ high-concentration region is disposed so as to adjoin the n− drift region at the n+ semiconductor substrate side of the inner part of the high-concentration p+ base region. Then this allows the n+ high-concentration region to be pinched off by the depletion layer extending from the pn junction between the high-concentration p+ base region and both of the n+ high-concentration region and the n− drift region to the n− drift region side. Thus this can prevent the breakdown voltage from lowering. Further, according to the first embodiment, the fourth semiconductor region is disposed so as to adjoin the first semiconductor region at the semiconductor substrate side of the inner part of the second semiconductor region. Then the current flowing from the drain electrode to the source electrode flows from the whole of the n− drift region to the high-concentration region, passing the n+ high-concentration region to flow into the JFET region. Thus the invalid region, in which almost no current flows, is not formed. Therefore, this allows the effective resistance of the n− drift region to decrease and then permits the on-state resistance to decrease.

Second Embodiment

Figure 5:
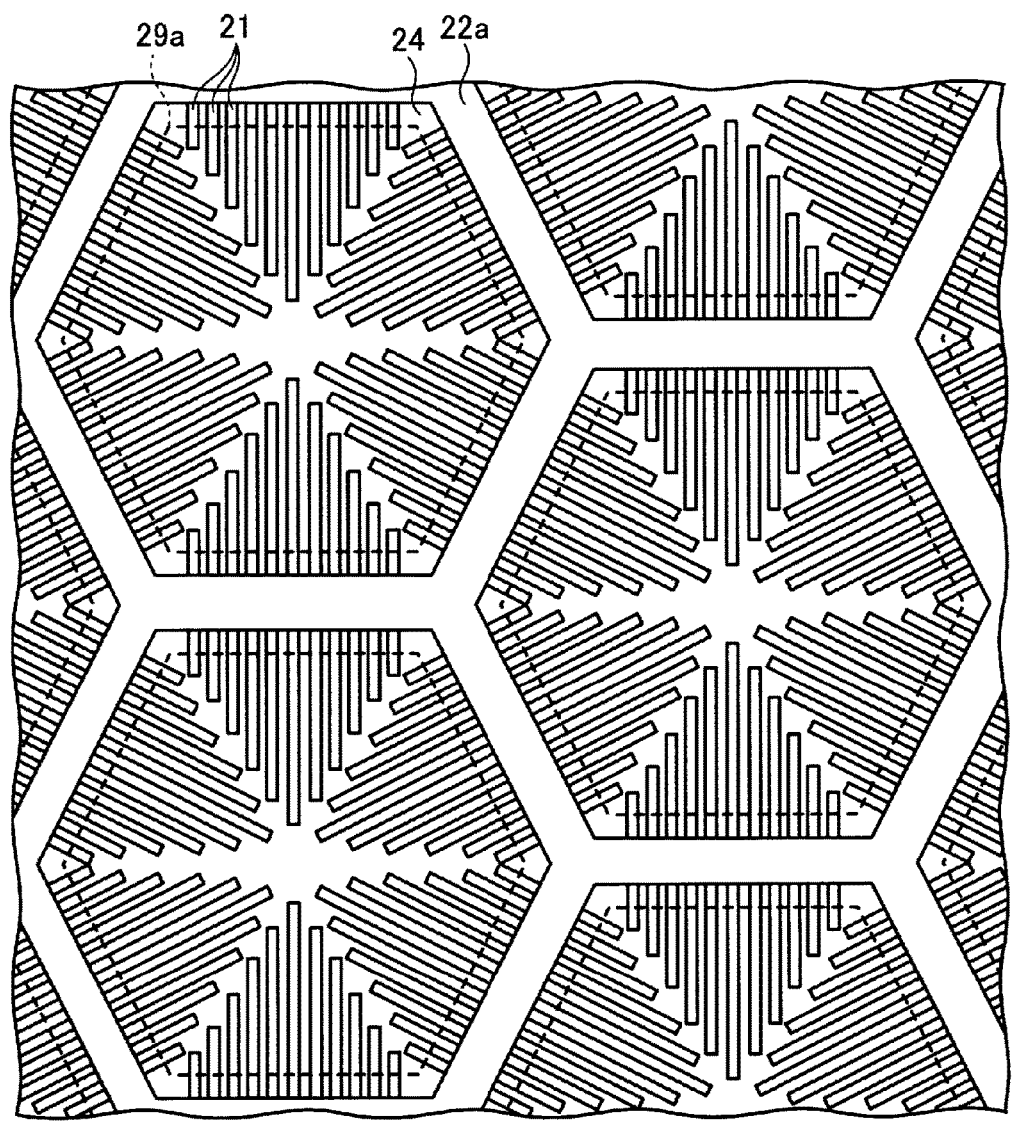
FIG. 5 is a plan view illustrating a structure of a semiconductor device according to a second embodiment.

Next, a structure of a semiconductor device according to the second embodiment will be described. FIG. 5 is a plan view illustrating the structure of the semiconductor device according to the second embodiment. The semiconductor device according to the second embodiment is different from that according to the first embodiment in that there is disposed a high-concentration base region 24 having a hexagonal planar figure. In this case, a contact region (not shown) has the polygonal (for example hexagonal) planar figure, and the high-concentration base region 24 is disposed so as to surround the circumference of the end portion of the contact region located at the semiconductor substrate 1 side. An high-concentration region 21 is, for example, arranged by a stripe-shaped planar layout extending from the hexagonal center of the high-concentration base region 24 to each of the sides. A reference numeral 22a corresponds to the JFET region. A reference numeral 29a corresponds to the edge of the gate electrode.

As described above, according to the second embodiment, it is possible to obtain a result similar to the first embodiment.

Third Embodiment

Figure 6:
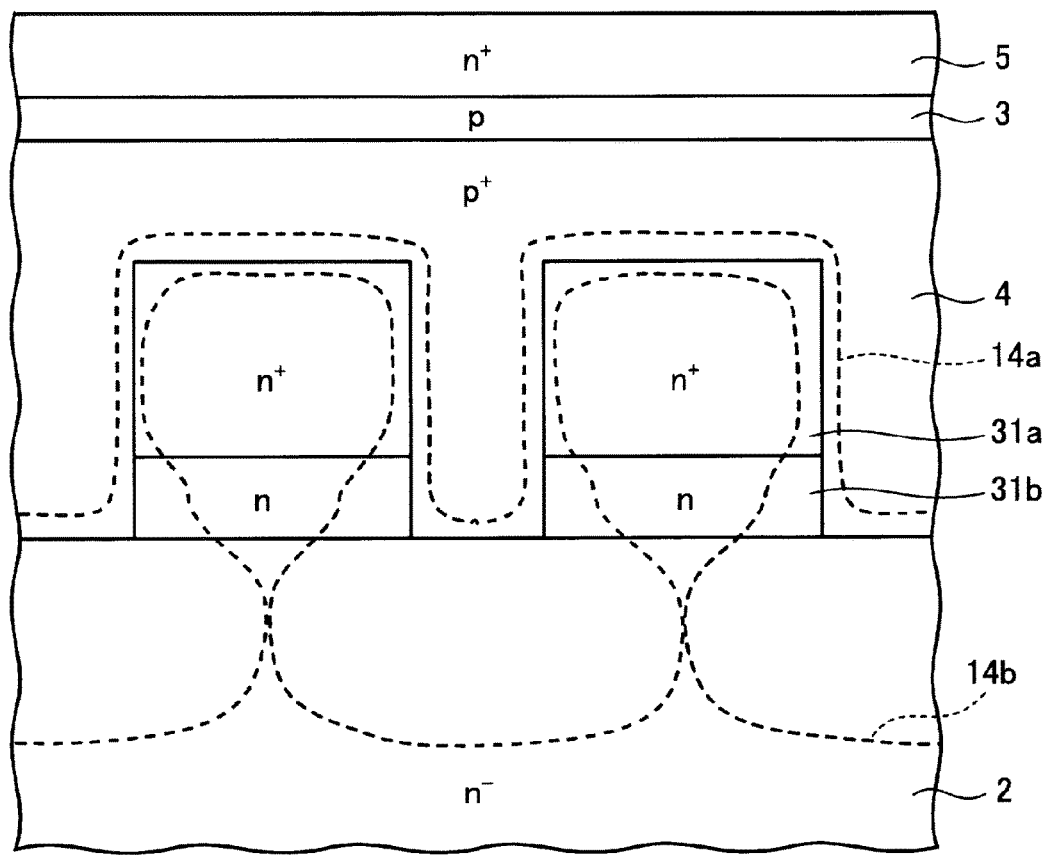
FIG. 6 is a sectional view illustrating a structure of a semiconductor device according to a third embodiment.

Next, a structure of a semiconductor device according to the third embodiment will be described. FIG. 6 is a sectional view illustrating the structure of the semiconductor device according to the third embodiment. The semiconductor device according to the third embodiment is different from that according to the first embodiment in that impurity concentration of an n+ high-concentration region 31 is set to be lower at the semiconductor substrate 1 side thereof than that at the p-channel region 3 side thereof. Concretely, the high-concentration region 31 is composed of a first high-concentration region 31a located at the p-channel region 3 side thereof and a second n high-concentration region 31b, whose concentration is lower than that of the first $n^+$ high-concentration region 31a, located at the $n^+$ semiconductor substrate 1 side thereof.

Figure 7:
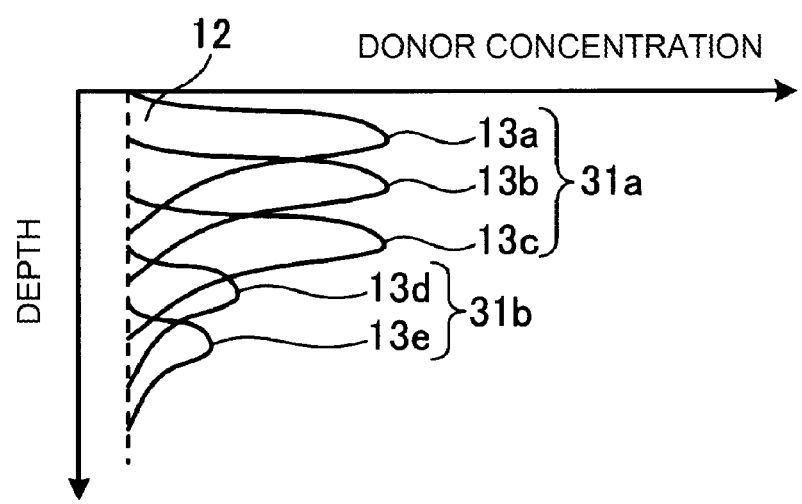
FIG. 7 is a characteristic curve illustrating an impurity concentration distribution of an $n^+$ high-concentration region in the semiconductor device according to the third embodiment.

An impurity concentration distribution of the $n^+$ high-concentration region 31 in the semiconductor device according to the third embodiment will be described. FIG. 7 is a characteristic curve illustrating the impurity concentration distribution of the $n^+$ high-concentration region in the semiconductor device according to the third embodiment. FIG. 7 shows the impurity concentration distribution of the $n^+$ high-concentration region 31 in the depth direction heading from the p-channel region 3 side thereof to the $n^+$ semiconductor substrate 1 side thereof. The top surface in FIG. 7 corresponds to the interface between the high-concentration $p^+$ base region 4 and the $n^+$ high-concentration region 31, and the bottom surface therein corresponds to the interface between the $n^+$ high-concentration region 31 and the $n^-$ drift region 2. Since an impurity diffuses to an extremely small extent in the wide band gap semiconductor, a plurality of ion implantations having different acceleration voltages each other are performed normally as a method to introduce the impurity uniformly in the depth direction.

In the third embodiment, the $n^+$ high-concentration region 31 composed of n-type implantation regions 13a to 13e, whose impurity concentrations (donor concentrations) are different from each other, may be formed by performing a plurality of the ion implantations having different acceleration voltages. At the time, ion implantation having a high acceleration voltage, which is, namely, the ion implantation performed from the interface between the high-concentration $p^+$ base region 4 and the $n^+$ high-concentration region 31 to a deep region, is performed with a dosage smaller than that having a low acceleration voltage. Then, this derives to form the first $n^+$ high-concentration region 31a composed of the n-type implantation profile 13a to 13c, which are located at shallow places from the interface between the high-concentration $p^+$ base region 4 and the $n^+$ high-concentration region 31, and the second n high-concentration region 31b composed of the n-type implantation profile 13d to 13e, which have impurity concentrations lower than the first $n^+$ high-concentration region 31a.

Thus, disposing the first $n^+$ high-concentration region 31a and the second n high-concentration region 31b allows n high-concentration region 31 to be pinched off easily. Further this can prevent the breakdown voltage from decreasing.

As described above, according to the third embodiment, it is possible to obtain a result similar to the first and second embodiments.

Fourth Embodiment

Figure 8:
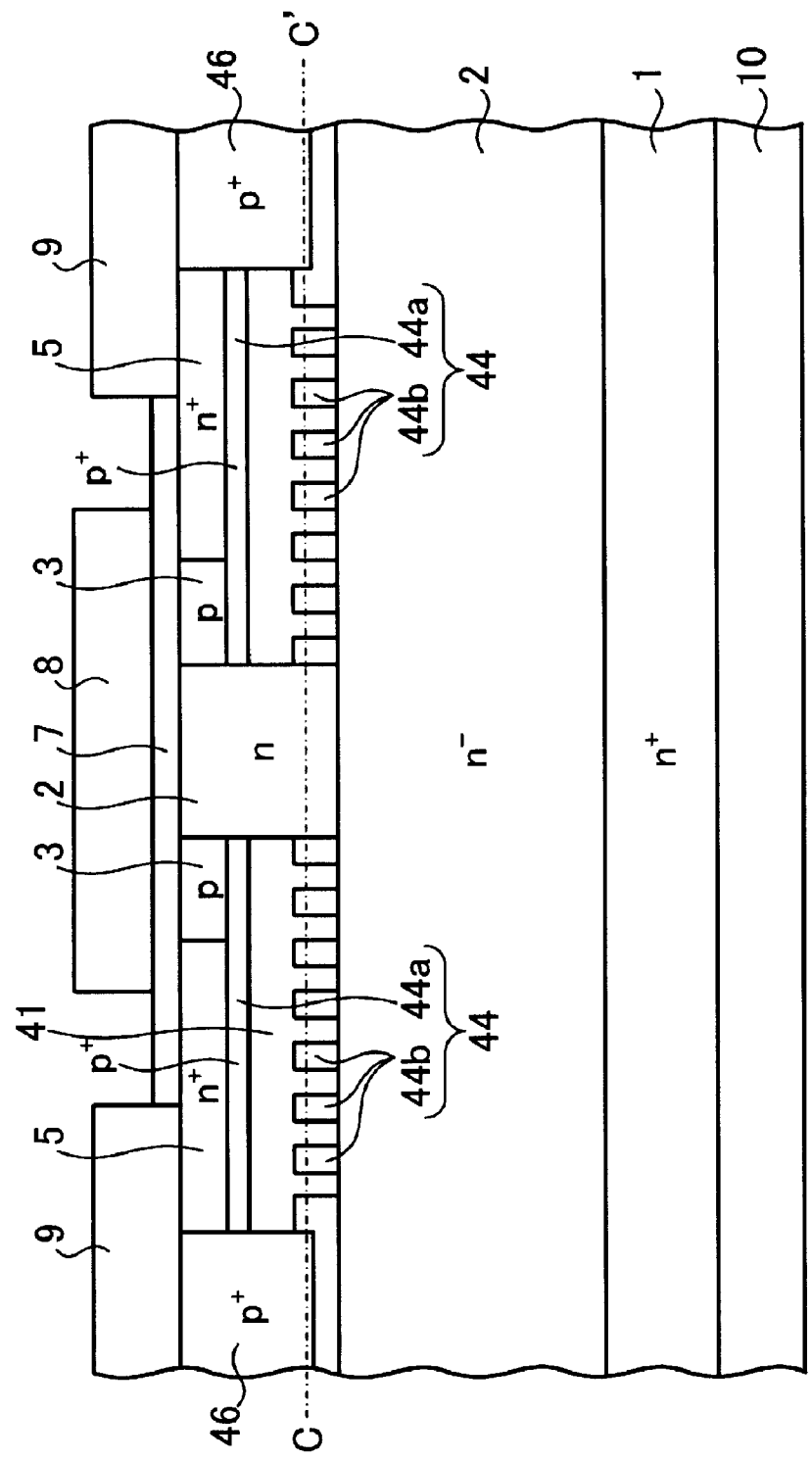
FIG. 8 is a sectional view illustrating a structure of a semiconductor device according to a fourth embodiment.
Figure 9:
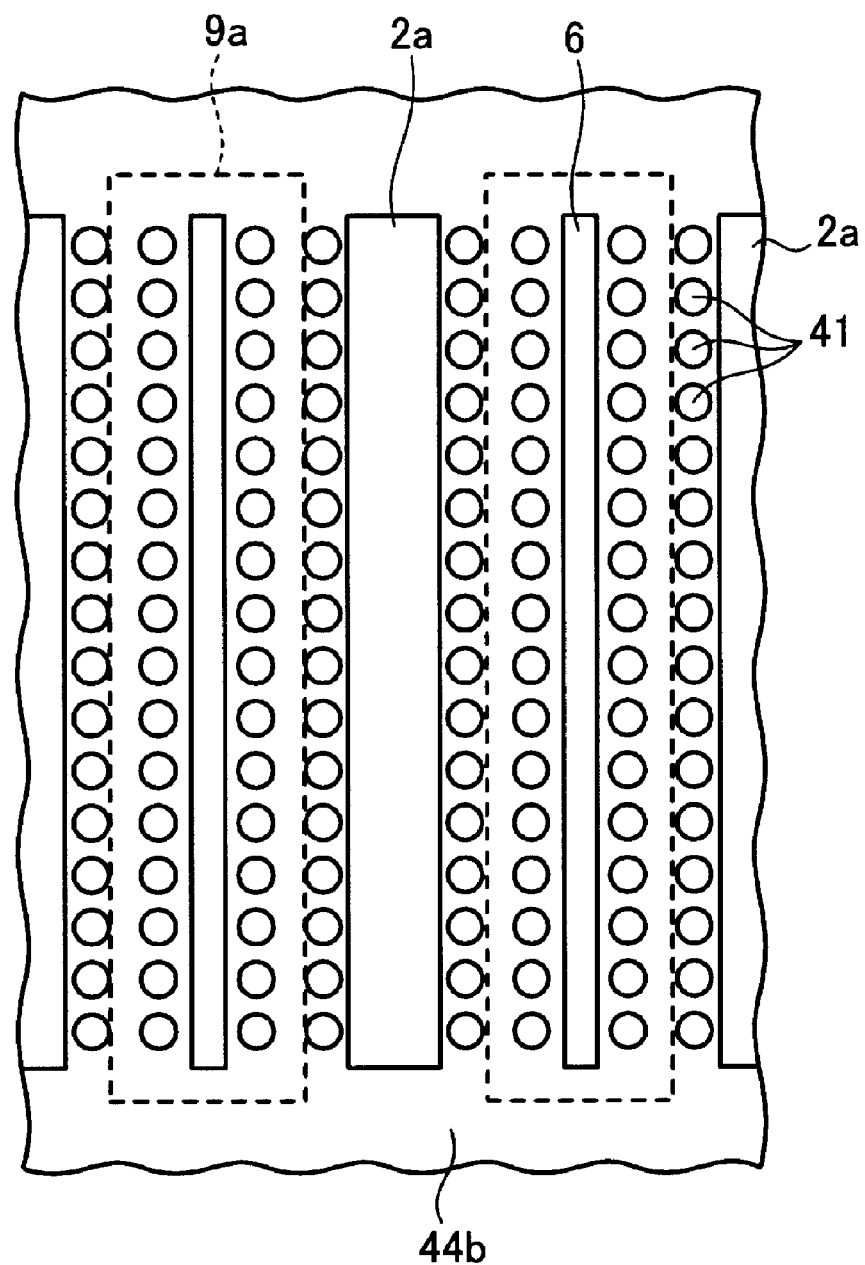
FIG. 9 is a plan view cut along the line C-C' shown in FIG. 8.

Next, a structure of a semiconductor device according to the fourth embodiment will be described. FIG. 8 is a sectional view illustrating the structure of the semiconductor device according to the fourth embodiment. FIG. 9 is a plan view cut along the line C-C' shown in FIG. 8. The semiconductor device according to the fourth embodiment differs from that according to the first embodiment in the next three points. The first point is different in that a high-concentration $p^+$ base region 44 is separated by an $n^+$ high-concentration region 41 into a first high-concentration $p^+$ base region (a third region) 44a located at the p-channel region 3 side thereof and a second high-concentration $p^+$ base region (a fourth region) 44b located at the $n^+$ semiconductor substrate 1 side thereof.

The second point is different in that the $n^+$ high-concentration region 41 adjoins the first high-concentration $p^+$ base region 44a at the whole surface located at the p-channel region 3 side thereof and penetrates partially through the second high-concentration $p^+$ base region 44b at the $n^+$ semiconductor substrate 1 side thereof to reach the $n^-$ drift region 2. Concretely, a part located at the $n^+$ semiconductor substrate 1 side of the $n^+$ high-concentration region 41 is disposed inside the second high-concentration $p^+$ base region 44b and arranged in a dot shape. Then this allows the resistance to decrease to the transverse direction (the direction orthogonal to the depth direction) in the $n^+$ high-concentration region 41. Further, when reverse-biased, this allows a part of the $n^+$ high-concentration region 41 in which the part is sandwiched between the second high-concentration $p^+$ base regions 44b to be pinched off, preventing the breakdown voltage from decreasing.

The third point is different in that a $p^+$ contact region 46 penetrates through the p-channel region 3, the first high-concentration $p^+$ base region 44a, and the $n^+$ high-concentration region 41 in the depth direction to reach the second high-concentration $p^+$ base region 44b. Then this allows the first high-concentration $p^+$ base region 44a to connect the second high-concentration $p^+$ base region 44b electrically through the $p^+$ contact region 46. In FIG. 8, the $n^+$ source region 5 penetrates through the p-channel region 3 in the depth direction to reach the first high-concentration $p^+$ base region 44a. However, the $n^+$ source region 5 may adjoin the first high-concentration $p^+$ base region 44a through the p-channel region 3.

Further, likewise the third embodiment, an impurity concentration of the part, which is sandwiched between the second high-concentration $p^+$ base regions 44b, may be lower in one part located at the $n^+$ semiconductor substrate 1 side of the $n^+$ high-concentration region 41 (second n high-concentration region) than in the other part located at the p-channel region 3 side of the $n^+$ high-concentration region 41 (first $n^+$ high-concentration region). Then this allows a trade-off relationship to be improved between the breakdown voltage and the resistance in the transverse direction of the $n^+$ high-concentration region 41.

As described above, according to the fourth embodiment, it is possible to obtain an effect similar to the first to the third embodiment.

Fifth Embodiment

Figure 10:
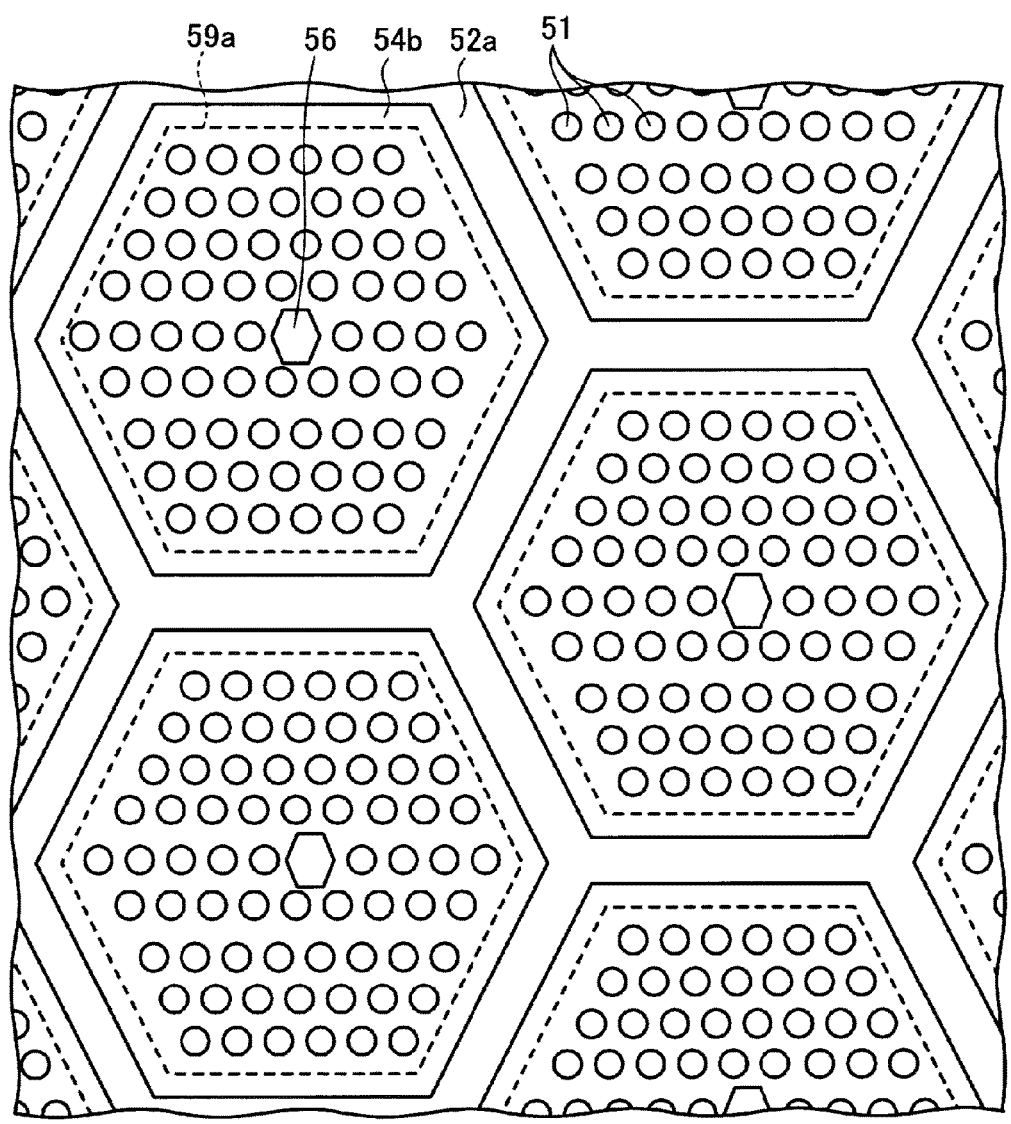
FIG. 10 is a plan view illustrating a structure of a semiconductor device according to a fifth embodiment.

Next, a structure of a semiconductor device according to the fifth embodiment will be described. FIG. 10 is a plan view illustrating the structure of the semiconductor device according to the fifth embodiment. The semiconductor device according to the fifth embodiment is different from that according to the fourth embodiment in that a second high-concentration $p^+$ base region 54b is disposed with a hexagonal planar figure. In this case, a $p^+$ contact region 56 has the hexagonal planar figure, and the second high-concentration $p^+$ base region 54b is disposed so as to surround the circumference of the edge of the gate electrode.

A reference numeral 52a shows a JFET region.

As described above, according to the fifth embodiment, it is possible to obtain an effect similar to the first to fourth embodiments.

Sixth Embodiment

Figure 11:
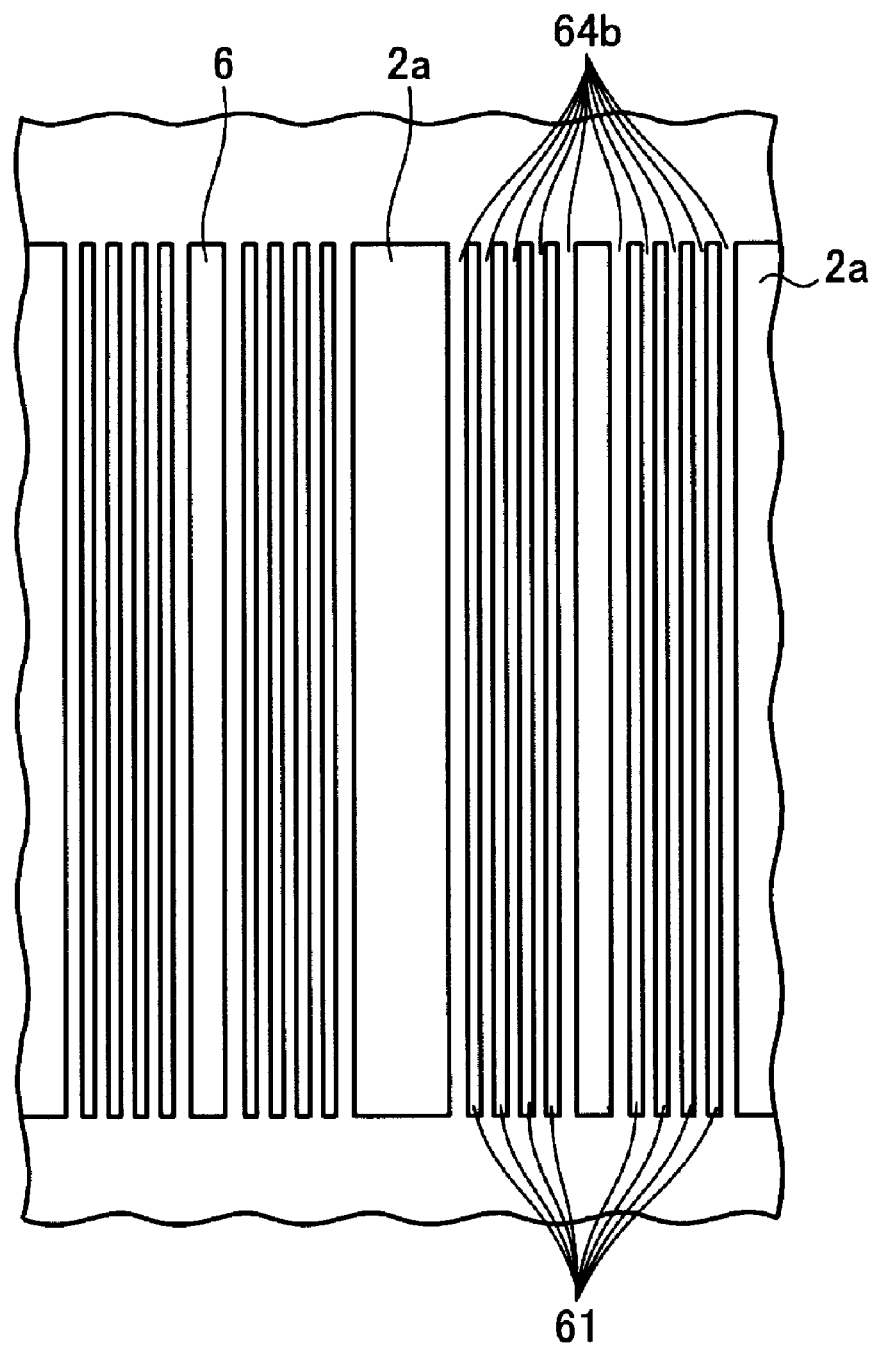
FIG. 11 is a plan view illustrating a structure of a semiconductor device according to a sixth embodiment.

Next, a structure of a semiconductor device according to the sixth embodiment will be described. FIG. 11 is a plan view illustrating the structure of the semiconductor device according to the sixth embodiment. The semiconductor device according to the sixth embodiment is different from that according to the fourth embodiment in that a part of an $n^+$ high-concentration region 61, of which the part is disposed inside the second high-concentration $p^+$ base region 64b at the $n^+$ semiconductor substrate 1 side, is arranged by a stripe-shaped planar layout extending to the direction orthogonal to the direction that the high-concentration $p^+$ base regions lineup. That is, the second high-concentration $p^+$ base region 64b is also arranged by the stripe-shaped planar layout extending to the direction orthogonal to the direction that the high-concentration $p^+$ base regions line up.

As described above, according to the sixth embodiment, it is possible to obtain an effect similar to the first to fifth embodiments.

Seventh Embodiment

Figure 12:
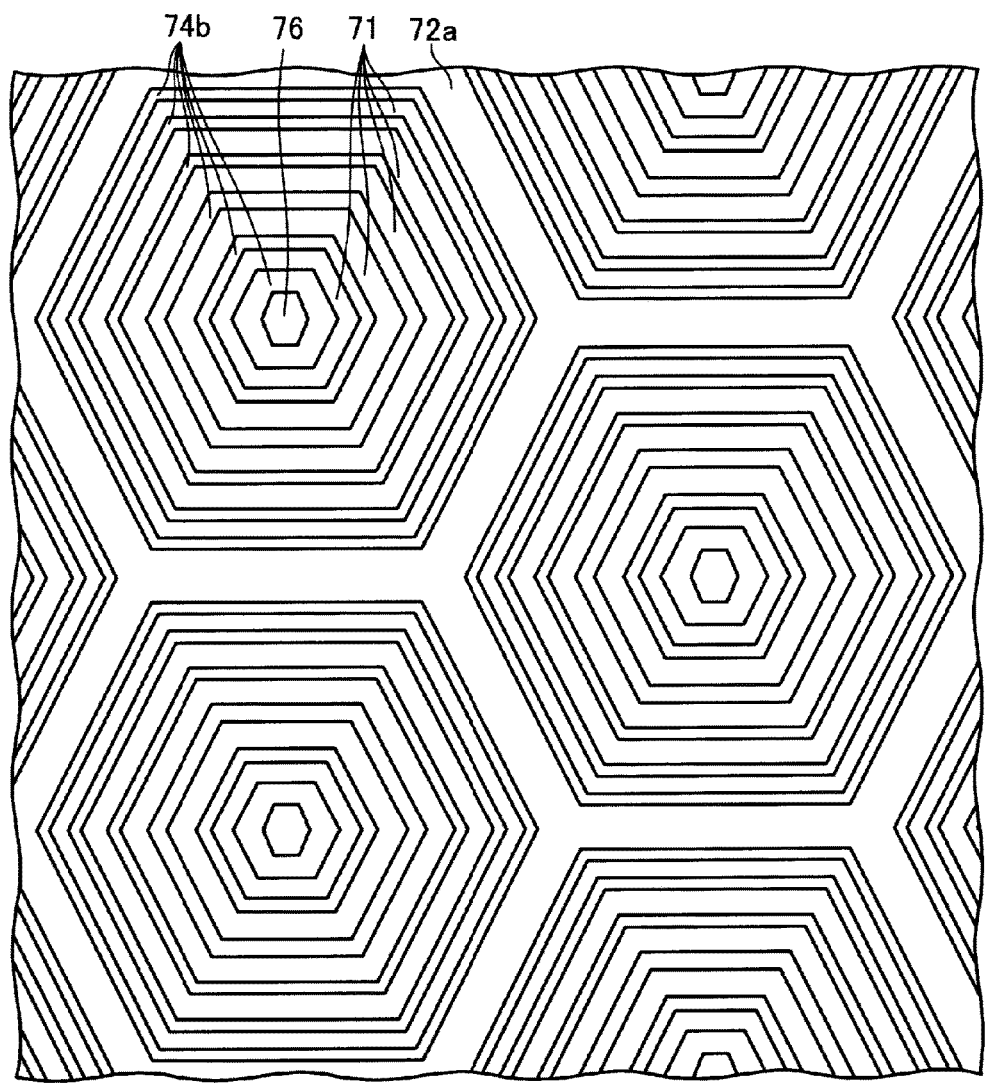
FIG. 12 is a plan view illustrating a structure of a semiconductor device according to a seventh embodiment.

Next, a structure of a semiconductor device according to the seventh embodiment will be described. FIG. 12 is a plan view illustrating the structure of the semiconductor device according to the seventh embodiment. The semiconductor device according to the seventh embodiment is different from that according to the sixth embodiment in that a second high-concentration $p^+$ base region 74b is disposed with a hexagonal planar figure. In this case, the $p^+$ contact region 76 has the hexagonal planar figure, and the second high-concentration $p^+$ base region 74b is disposed so as to surround the circumference of the end portion of the $p^+$ contact region 76 located at the $n^+$ semiconductor substrate 1 side thereof.

A source contact (not shown), as similar to the second embodiment, has a hexagonal inside diameter narrower slightly than the second high-concentration $p^+$ base region 74b. The periphery of the $p^+$ contact region 76 is exposed around the $p^+$ contact region 76 in the source contact. The $n^+$ semiconductor substrate 1 side of an $n^+$ high-concentration region 71 is selectively disposed so as to surround the $p^+$ contact region 76 with the hexagonal planar figure at a part opposite to the source contact located at the inner part of the high-concentration $p^+$ base region 74b. A reference numeral 72a shows a JFET region.

As described above, according to the seventh embodiment, it is possible to obtain an effect similar to the first to the sixth embodiment.

Eighth Embodiment

Figure 13:
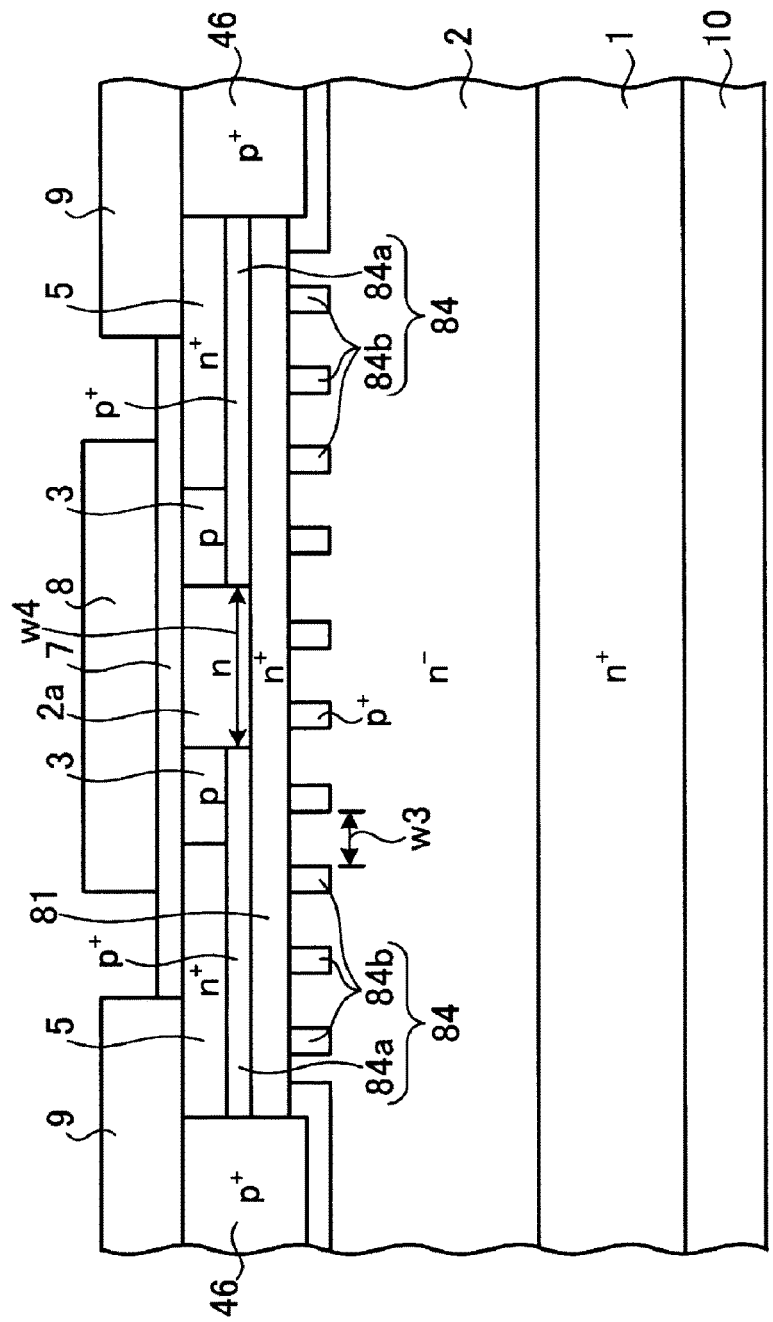
FIG. 13 is a sectional view illustrating a structure of a semiconductor device according to an eighth embodiment.
Figure 14:
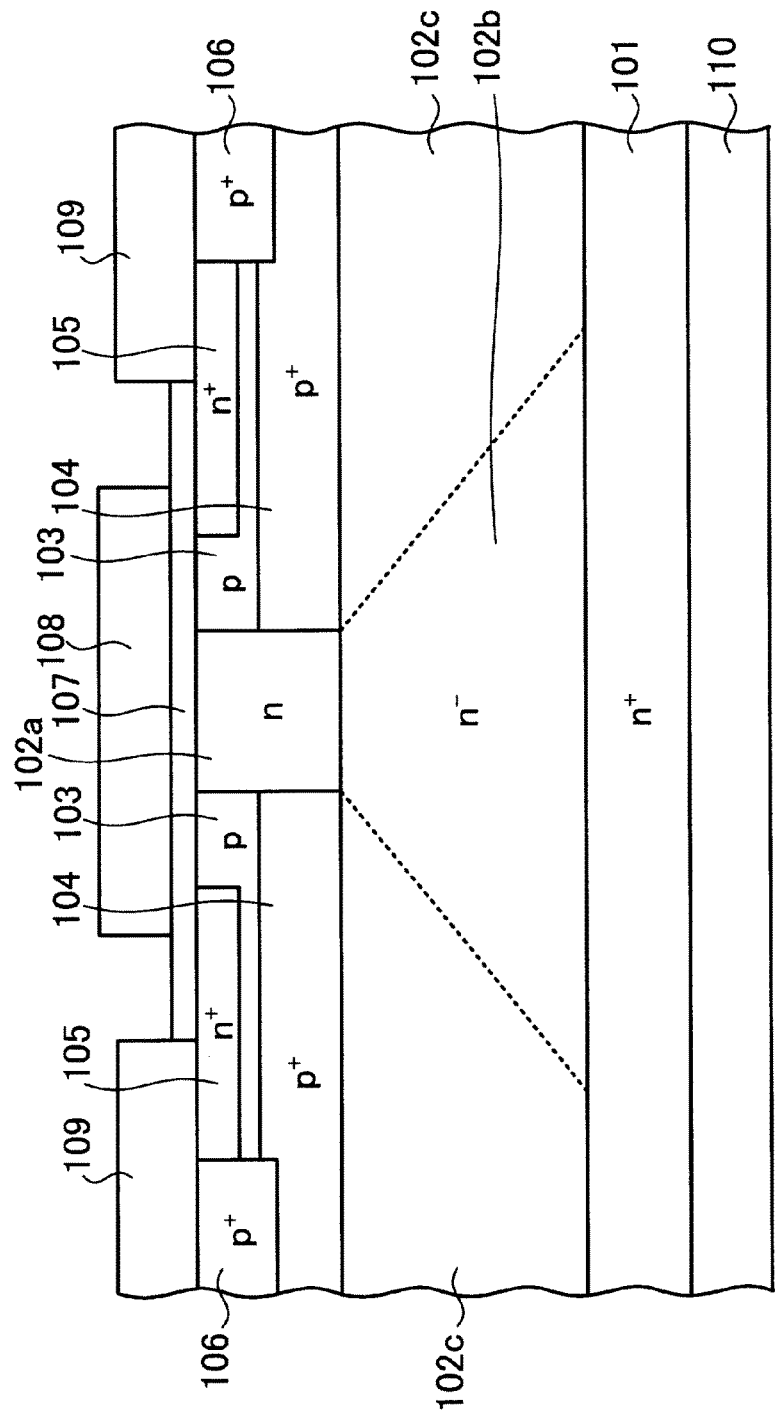
FIG. 14 is a sectional view illustrating a structure of a conventional SiC vertical MOSFET.

Next, a structure of a semiconductor device according to the eighth embodiment will be described. FIG. 13 is a sectional view illustrating the structure of the semiconductor device according to the eighth embodiment. The semiconductor device according to the eighth embodiment differs from that according to the fourth embodiment in the next two points. The first point is different in that an $n^+$ high-concentration region 81 is disposed over the area covering high-concentration $p^+$ base regions 84 crossing the JFET region 2a next thereto. The second point is different in that a space w3 between second high-concentration $p^+$ base regions 84b is narrower than a space w4 between first high-concentration $p^+$ base regions 84a (namely, a width of the JFET region 2a in which the width is positioned in parallel to the direction that the high-concentration $p^+$ base regions 4 line up).

Concretely, the JFET region 2a is disposed between the first high-concentration $p^+$ base regions 84a next to each other. The JFET region 2a and the $n^+$ high-concentration region 81 may have the same impurity concentration. The $n^+$ high-concentration region 81 adjoins the first high-concentration $p^+$ base region 84a and the JFET region 2a. A part of the $n^+$ high-concentration region 81 in which the part adjoins the JFET region 2a constitutes the JFET region. The JFET regions 2a in the cells next to each other are mutually connected by the $n^+$ high-concentration region 81. The second high-concentration $p^+$ base region 84b is selectively disposed on the surface layer of the $n^-$ drift region 2 at the interface between the $n^+$ high-concentration region 81 and the $n^-$ drift region 2. Since the space w3 between the second high-concentration $p^+$ base regions 84b is narrower than the space w4 between the first high-concentration $p^+$ base regions 84a, the second high-concentration $p^+$ base region 84b is also arranged at a position opposite to the JFET region 2a so as to sandwich the $n^+$ high-concentration region 81.

The part sandwiched by the second high-concentration $p^+$ base regions 84b may be the $n^+$ high-concentration region 81 as similar to the fourth embodiment. Further, the space w4 between the first high-concentration $p^+$ base regions 84a (namely, a width of the JFET region in which the width is positioned in parallel to the direction that the high-concentration $p^+$ base regions 4 line up) may be set to be narrower in order to reduce the cell pitch. In that case, even though the space w4 between the first high-concentration $p^+$ base regions 84a is set to be narrower than the space w3 between the second high-concentration $p^+$ base regions 84b, it is possible to obtain a similar effect by increasing the impurity concentration of the JFET region 2a and a part where the $n^+$ high-concentration region 81 functions as the JFET region. The planar layout of the second high-concentration $p^+$ base region 84b may be similar to the fifth to the seventh embodiment.

As described above, according to the eighth embodiment, it is possible to obtain an effect similar to the first to the seventh embodiment. Further, according to the eighth embodiment, the JFET regions in the cells next to each other are mutually connected by the $n^+$ high-concentration region. Then this allows the JFET resistance to decrease. Thus, this permits the on-state resistance to decrease. Furthermore, according to the eighth embodiment, the $n^+$ high-concentration region 81 functions as the JFET region. Then this allows the impurity concentration of the JFET region to increase. Thus this permits the resistance of the JFET region to decrease. Moreover, the space between the second high-concentration $p^+$ base regions is set to be narrower than the space between the first high-concentration $p^+$ base regions. Then this allows the JFET resistance to decrease without increasing the cell pitch and also permits the $n^-$ drift region to be easily pinched off at the part sandwiched by the second high-concentration $p^+$ base regions.

According to the foregoing description, the present invention is not limited to the above described embodiments and changeable variously within the scope being not deviated from the gist thereof. For example, according to each of the embodiments, there are descriptions using examples that the part sandwiched by the high-concentration $p^+$ base regions (or the second high-concentration $p^+$ base regions) in the n-type regions (the $n^+$ high-concentration region and the $n^-$ drift region) is arranged in a stripe-shaped or dot-shaped manner. However, if the sandwiched part of the n-type regions can be easily pinched off by the depletion layer extending from the pn junction between the high-concentration $p^+$ base region and the n-type regions to the $n^-$ drift region side, it is sufficient, and then the planar layout of the sandwiched part in the n-type regions may be another type of shape. Further, the first conductivity type is assigned to n-type, and the second conductivity type to p-type according to each of the embodiments. But, it is also true similarly that the first conductivity type is assigned to p-type, and the second conductivity type to n-type in the present invention. Furthermore, it is also possible to obtain a similar effect about a non-punch through type IGBT using a p-type conductive semiconductor substrate or a punch through type IGBT in which a relatively high-concentration n-type buffer layer or an n-type field stop layer is disposed between a semiconductor substrate and an n-type low-concentration drift layer.

INDUSTRIAL APPLICABILITY

As described above, a semiconductor device according to the present invention is useful for a power semiconductor device employed in an inverter, a switching power supply, and the like.

EXPLANATIONS OF LETTERS OR NUMERALS

1: $n^+$ semiconductor substrate
2: $n^-$ drift region
2a, 22a, 52a, 72a: JFET region
3: p-channel region
4, 24, 44, 84: High-concentration $p^+$ base region
5: $n^+$ source region
6, 46, 56, 76: $p^+$ contact region
7: Gate dielectric film
8: Gate electrode
9: Source electrode
9a, 29a, 59a: Source contact
10: Drain electrode
11, 21, 31, 41, 51, 61, 71, 81: $n^+$ high-concentration region
12: Current
13a to 13e: n-type diffusion region
31a: First $n^+$ high-concentration region
31b: Second n high-concentration region
44a, 84a: First high-concentration $p^+$ base region
44b, 54b, 64b, 74b, 84b: Second high-concentration $p^+$ base region

What is claimed is:

1. A semiconductor device, comprising:
a semiconductor substrate composed of a semiconductor material with a band gap wider than silicon, wherein the semiconductor substrate has a first conductivity type or a second conductivity type;
a first-conductive first semiconductor region composed of the semiconductor material having an impurity concentration lower than the semiconductor substrate, wherein the first-conductive first semiconductor region is disposed on a front surface of the semiconductor substrate;
a second-conductive second semiconductor region disposed selectively on a surface layer of the first semiconductor region, wherein the surface layer is disposed at a side opposite to the semiconductor substrate;
a first-conductive third semiconductor region disposed selectively inside the second semiconductor region;
a first-conductive fourth semiconductor region, which is separated from the third semiconductor region, having an impurity concentration higher than the first semiconductor region, wherein the first-conductive fourth semiconductor region is selectively disposed inside the second semiconductor region and adjoins the first semiconductor region at least at a part thereof;
a gate electrode disposed through a gate dielectric film on a surface stretching from one to another of parts sandwiched between the third semiconductor region and the first semiconductor region in each of a plurality of the second semiconductor regions via a surface of the first semiconductor region next to the parts;
a first electrode contacting with the second semiconductor region and the third semiconductor region; and
a second electrode contacting with a back surface of the semiconductor substrate.

2. The semiconductor device according to claim 1, wherein the second semiconductor region comprises a first region adjoining the gate dielectric film and a second region that has an impurity concentration higher than the first region and adjoins the first region at the semiconductor substrate side thereof,
wherein the fourth semiconductor region is selectively disposed inside the second region.

3. The semiconductor device according to claim 2, wherein the second region is divided into a third region disposed at a first region side thereof and a fourth region disposed at a semiconductor substrate side thereof by the fourth semiconductor region, and
wherein a part of the fourth semiconductor region of which the part is disposed at a fourth region side is selectively disposed inside the fourth region so as to adjoin the first semiconductor region.

4. The semiconductor device according to claim 3, wherein the fourth semiconductor region and the fourth region are further disposed between one part of the first semiconductor region in which the one part adjoins the gate dielectric film and another part of the first semiconductor region.

5. The semiconductor device according to claim 4, wherein the semiconductor material is silicon carbide, gallium nitride, or diamond.

6. The semiconductor device according to claim 2, wherein the second region is divided into a third region disposed at a first region side thereof and a fourth region disposed at a semiconductor substrate side thereof by the fourth semiconductor region, and
wherein a part of the first semiconductor region of which the part is disposed at a fourth region side is selectively disposed inside the fourth region so as to adjoin the fourth semiconductor region.

7. The semiconductor device according to claim 6, wherein the semiconductor material is silicon carbide, gallium nitride, or diamond.

8. The semiconductor device according to claim 2, wherein the semiconductor material is silicon carbide, gallium nitride, or diamond.

9. The semiconductor device according to claim 3, wherein the semiconductor material is silicon carbide, gallium nitride, or diamond.

10. The semiconductor device according to claim 1, wherein an impurity concentration of a one part adjoining the gate dielectric film of the first semiconductor region is higher than that of an impurity concentration of another part of the first semiconductor region.

11. The semiconductor device according to claim 10, wherein the semiconductor material is silicon carbide, gallium nitride, or diamond.

12. The semiconductor device according to claim 1, wherein the semiconductor substrate has the second conductivity type, and the semiconductor device has a first-conductive region having an impurity concentration higher than the first semiconductor region, wherein the first-conductive region is disposed between the first-conductive first semiconductor region and the semiconductor substrate having the second conductivity type.

13. The semiconductor device according to claim 12, wherein the semiconductor material is silicon carbide, gallium nitride, or diamond.

14. The semiconductor device according to claim 1, wherein the semiconductor material is silicon carbide, gallium nitride, or diamond.

15. A semiconductor device, comprising:
   a substrate;
   a drift layer of a first conductivity type on the substrate;
   a base region of a second conductivity type in the drift layer;
   a source region of the first conductivity type in the base region; and
   a plurality of regions of the first conductivity type on the drift layer, each of the plurality of regions having an impurity concentration higher than an impurity concentration of the drift layer;
   wherein each of the plurality of regions is separated from another of the plurality of regions by the base region of the second conductivity type, and
   wherein each of the plurality of regions contacts a junction field effect transistor (JFET) region.

16. The semiconductor device of claim 15, wherein in a plan view each of the plurality of regions has a stripe shape and extends between two substantially rectangular JFET regions.

17. The semiconductor device of claim 15, wherein in a plan view each of the plurality of regions has a stripe shape and extends from a side of a JFET region having a polygonal outline.

18. The semiconductor device of claim 15, further comprising a channel region of the second conductivity type over at least a portion of the plurality of regions of the first conductivity type.

19. The semiconductor device of claim 18, wherein an impurity concentration of the base region is higher than an impurity concentration of the channel region.

20. The semiconductor device of claim 15, wherein the JFET region has the first conductivity type, and an impurity concentration of the JFET region is higher than the impurity concentration of the drift layer.

* * * * *